United States Patent
Derderian et al.

(10) Patent No.: US 6,940,181 B2
(45) Date of Patent: Sep. 6, 2005

(54) THINNED, STRENGTHENED SEMICONDUCTOR SUBSTRATES AND PACKAGES INCLUDING SAME

(75) Inventors: James M. Derderian, Boise, ID (US); Nathan R. Draney, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/690,339

(22) Filed: Oct. 21, 2003

(65) Prior Publication Data

US 2005/0085008 A1 Apr. 21, 2005

(51) Int. Cl.[7] .............................................. H01L 23/28
(52) U.S. Cl. ..................... 257/787; 257/753; 438/459; 438/460; 438/690; 438/691; 216/11; 216/48
(58) Field of Search .................... 438/15, 51, 459–460, 438/690–693; 216/11, 48, 88–89; 257/787–792, 753

(56) References Cited

U.S. PATENT DOCUMENTS

| | | | |
|---|---|---|---|
| 5,164,815 A | 11/1992 | Lim | |
| 5,313,102 A | 5/1994 | Lim et al. | |
| 5,476,566 A | 12/1995 | Cavasin | |
| 5,583,372 A | 12/1996 | King et al. | |
| 6,027,659 A | * 2/2000 | Billett | 216/11 |
| 6,184,064 B1 | 2/2001 | Jiang et al. | |
| 6,235,387 B1 | 5/2001 | Bennett et al. | |
| 6,245,677 B1 | 6/2001 | Haq | |
| 6,258,198 B1 | 7/2001 | Saito et al. | |
| 6,279,976 B1 | 8/2001 | Ball | |
| 6,403,449 B1 | 6/2002 | Ball | |
| 6,506,681 B2 | 1/2003 | Grigg et al. | |
| 6,534,419 B1 | 3/2003 | Ong | |
| 2003/0096507 A1 | 5/2003 | Baker et al. | |
| 2004/0110010 A1 | 6/2004 | Buchwalter et al. | |

FOREIGN PATENT DOCUMENTS

JP 359104523 6/1984

OTHER PUBLICATIONS

Wolf et al., "Silicon Processing for the VLSI Era," vol. 1: Process Technology, Lattice Press, 1986, pp. 238–239.

* cited by examiner

Primary Examiner—Dung A. Le
(74) Attorney, Agent, or Firm—TraskBritt

(57) ABSTRACT

A semiconductor wafer having a high degree of thinness and exhibiting an enhanced strength state. A layer of tenacious reinforcement material is disposed over, a back side of the wafer while in a rough state from backgrinding without prior, conventional polishing or plasma etching of the back side. The thin layer or film of reinforcement material fills grooves, fractures and scratches in the back side of the wafer, enhance the rigidity of the wafer and provide a planar, smooth, back side surface layer. The reinforcement material counteracts internal stresses of the wafer tending to warp, crack and propagate lattice defects in the wafer. The reinforcement material may also be configured to act as a die attach adhesive, may provide an ionic barrier, and may remain as part of the packaging for semiconductor dice singulated from the wafer.

23 Claims, 5 Drawing Sheets

THINNED, STRENGTHENED SEMICONDUCTOR SUBSTRATES AND PACKAGES INCLUDING SAME

BACKGROUND OF THE INVENTION

1. Field of the Invention

The present invention relates generally to processes and methods for fabricating electronic devices from semiconductor materials. More particularly, the present invention pertains to methods and apparatus offering improved process control for fabricating electronic devices having substrates of reduced thickness and enhanced quality.

2. State of the Art

The manufacture of semiconductor devices, commonly termed "dice" or "chips," encompasses a plurality of major manufacturing stages, each of which typically comprises a number of elements. In general, chip manufacture may be generalized as comprising the stages of crystal growth, wafer preparation, wafer fabrication, wafer sort, and packaging. Wafer sort and packaging may be performed in a different order, or combined into a single manufacturing stage. Typically, a wafer of a semiconductor material, such as silicon, is cut from a large crystal and may have a nominal diameter of up to about 300 mm (12 inches). Although larger bulk semiconductor substrates may have been fabricated, the 300 mm wafer is the largest size wafer currently being phased into commercial production runs by various semiconductor device manufacturers. As cut from a cylinder of semiconductor material transverse to the longitudinal axis thereof, a wafer typically has a thickness considerably greater than the usual end product of the semiconductor fabrication, i.e., singulated semiconductor dice.

A designated "active" surface of a bare wafer may be planarized, as by grinding and chemical-mechanical polishing (CMP) or etching (wet or dry) to a smoothness and planarity required for the formation of integrated circuits therein. A wafer 10 with a planarized active surface 12 and an unthinned back side surface 14 is shown in FIG. 2. The active surface 12 is shown as divided into a plurality of semiconductor dice 16 by "streets" 46. The bare back side surface 14 of the bare wafer 10 is shown in FIG. 3 as unthinned, unpolished and with a rough surface texture with "peaks" 24 and "valleys" 26 having a total amplitude 38 about a back side surface 14. As shown, the wafer 10 is to be thinned from an initial thickness 18 to a final thickness 22 at thinned back side surface 20. The wafer 10 has an overall nominal diameter 28 (FIG. 2) (but for the presence of a wafer flat, as is conventional).

The roughness parameter of a semiconductor surface may be defined in terms of distance between the surface and a straight line extending over the surface between two points. $R_t$ represents the distance between the highest peak and the lowest valley, i.e., the amplitude along the measured length. The $R_a$ surface roughness factor is defined as the arithmetic mean surface roughness measured along a sampling length and is the mean deviation from an imaginary line such that the areas bounded by the surface irregularities are equal above and below this imaginary line. $R_a$ may vary widely, particularly prior to or during rough backgrind of a wafer. The surface finish parameter $R_a$ of the active surface of a polished wafer prior to fabrication is desirably about 2–5 microinches.

An exemplary prior art process for fabricating semiconductor dice 16 from a bare wafer 10 is outlined in FIG. 1. In the industry, a bare wafer 10 (see FIG. 2) is provided in act 100 by in-house manufacture or by purchase. A vendor may preplanarize and polish the active surface 12 in act 102, or it may be performed by the chip manufacturer.

The fabrication act 104 of IC production is concentrated on the "active" surface 12 of the wafer 10, which has undergone preliminary abrasive thinning and planarization/etching acts to planarize and smooth the active surface 12. The active surface 12 typically has a flatness value of about 3–4 μm as measured by the maximum peak-to-valley deviation of the wafer surface from a reference plane extending thereacross. A plurality of sets of identical integrated circuit patterns are simultaneously formed in discrete locations on the active surface 12 by a series of layer deposition and etching processes, as known in the art. The sets of circuit patterns are formed in rows wherein the rows of patterns are separated in X- and Y-axes by streets 46 free of circuitry. Electrical components such as transistors, resistors, capacitors and the like, as well as interconnecting conductors, i.e., "metallization" are typically formed in each pattern. When the active surface 12 of a wafer 10 is not planar (flat), as, for example, due to warping, the use of patterning techniques, such as photolithography, to project a pattern onto the wafer surface results in distorted and out-of-specification image dimensions. Thus, a high degree of planarity is crucial to uniform high-yield production of semiconductor dice.

During fabrication acts 104, various methods of applying a layer of material on the active surface 12 may include screen-coating, stencil-coating, spin-coating, chemical vapor deposition (CVD), and others. Proper layer coverage and subsequent removal acts also depend upon a high degree of active surface planarity and smoothness. Achievement of this degree of planarity and smoothness has been dependent upon the use of wafers with relatively high thickness, in order to counteract internal stresses in the wafer which may lead to warping. Thus, in the current state of the art, a 300 mm (12 inch) wafer may be supplied for fabrication with an initial minimum thickness 18 of about 28–30 mils (about 0.711–0.762 mm).

As the industry moves toward denser circuitry and thinner packages, it has been necessary to reduce the initial thickness 18 of circuitized wafers 10 to a much lower value. Thus, current, conventional practice is to thin wafers to about 4 mils (0.1016 mm). Research and development efforts are working toward the goal of achieving wafers with an ultimate thickness of about 2 mils (0.0508 mm) or less, which would present significant advantages in chip manufacture and offer increased applications. However, the concurrent goal of increasing wafer diameter 28 exacerbates potential problems of wafer cracking, fracturing, and warping. The degree of warping has been generally found to be an inverse function of the square of wafer thickness. It is generally conceded that wafers of 8 inches (200 mm) nominal diameter, and even 5 inches (127 mm), require some sort of mechanical support during backgrinding to a thickness of about 7 mils and during subsequent handling.

Thus, in current practice, upon completion of the fabrication acts 104, a protective coating or layer 48 (FIG. 4), in the form of a polymer layer or of a so-called "backgrind tape," is applied to the circuitized active surface 12 in act 106 to protect and support the circuitry during a bulk thinning, i.e., backgrinding act 110. The protective coating application is generally illustrated in FIG. 4 and various methods of the prior art are discussed, infra.

For the backgrinding act 110, the active surface 12 with attached protective layer 48 is first mounted in a chuck (not shown) in act 108 to expose the back side surface 14 of wafer 10 for grinding. The backgrinding act 110 is performed to remove extraneous material from the wafer (thinning the wafer 10) from an initial thickness represented by back side surface 14 (see FIG. 4) to a desired thinned back side surface 20, at which point the wafer has a final thickness 22 (see FIG. 3). Typically, this material removal is conducted by a backgrinding act using an abrasive grinding pad or wheel 32 with abrasive particles 36 moved in one or more lateral directions 33 with respect to the plane of wafer 10 (see FIG. 4). Backgrinding generally leaves the back side surface 14 in a rough state, with a significant penetration of, and damage to, the crystal lattice (see FIG. 5). Lateral impact of the abrasive particles 36 against surface features in the form of peaks 24 with forces 34 cause further damage. Damage has been observed at depths of up to about 100 $\mu$m into the crystal lattice of a wafer 10. Thus, a further planarization act 112 is typically conducted to reduce back side surface damage from the backgrinding act 110.

Planarization approaches to reducing the back side surface damage due to rough grinding have generally been either to (a) perform a fine polishing by chemical-mechanical polishing (CMP) following backgrinding, or (b) plasma (dry) etch or (less commonly) wet etch the back side surface in act 112. These processes require the rough grinding to be halted prior to attaining the desired final thickness 22, so that the damaged zone of the crystal lattice will be removed in act 112. While these procedures smooth the back side surface 14 to reduce grinding damage, they have little or no beneficial effect upon warping tendencies. In fact, the additional thinning may enhance the proclivity of a wafer for warping. In the past, where wafer thicknesses as low as about 7–20 mils (about 180–500 $\mu$m) were considered adequate, the above-described processes worked relatively well. However, fine polishing and/or plasma-etching of back side surfaces of very thin wafers, i.e., having thicknesses of about 4 mils (about 100 $\mu$m) or even 2 mils (about 50 $\mu$m), is incapable of achieving the desired yield of dice free of unacceptable warping, cracking and even fracturing of the semiconductor material. The problem is greatly exacerbated by using wafers having larger diameters. For example, a wafer may require thinning from an initial thickness of 28 mils to a final thickness of 4 mils. In the thinned state, residual stresses (including backgrinding stresses) in the wafer tend to warp the wafer, a condition also known as "dishing," which is evident upon removal of a wafer from the chuck and/or upon removal of the protective layer 48 from the active surface 12. Damage due to backgrind thinning may lead to wafer fracture at the time of thinning (backgrinding act 110), upon release from the chuck in act 114, upon removal of a protective layer 48 from the active surface 12 in act 116, during attachment of a removable wafer dicing tape to the wafer in act 118, in die singulation in act 120, and in packaging (act 122) in act 122. Furthermore, while the rough grinding act is short (time-wise) and relatively inexpensive, the subsequent polishing or etch processes in act 112 are time-consuming and fairly expensive to conduct.

The role of the back side surface of the wafer, if any, is typically that of a mounting surface used to attach an individual semiconductor die to a carrier substrate of some sort. For example, the back side of a semiconductor die may be attached to a lead frame paddle, to an interposer, to a circuit board, to another die, or to some other substrate. In other instances, such as in the case of leads-over-chip packaging or in certain chip-scale packaging configurations, the back side of a semiconductor die may be encapsulated or merely coated. However, as package sizes have decreased, reduction in die (and thus wafer) thickness has been emphasized to reduce the thickness of the resulting packaged electronic device. Wafer thinning and planarization of the back side are required to reduce the wafer thickness to a desired dimension and provide a desired surface smoothness. The continual goal of producing integrated circuits of greater density (memory or logic components per unit volume) necessitates that semiconductor dice be of minimal thickness while retaining sufficient resistance to breakage, warping, electrical degradation and dislocation formation. It is anticipated that reducing wafer thickness to the range of 2 mils or less will become commercially feasible in the near future, making the prevention of such damage even more difficult.

Thinning of a wafer in a controlled manner to a precise endpoint is an exacting process. In addition to simple grinding, other methods of thinning or planarizing the active surfaces of semiconductors include (a) wet etching using an aqueous etchant; (b) dry etching using a dry etchant; (c) sputter-etching to physically remove material; (d) abrasive planarization by, i.e., material removal using a pad in combination with an abrasive slurry; (e) CMP by pad buffing in the presence of a slurry of abrasive particles and a chemical etchant; and (f) sequential combinations of the above processes. Typically, current wafer thinning techniques may require a plurality of wafer grinding and polishing disks. Thinning is typically started with a coarse grinding disk and completed with a fine polishing disk. Because of surface damage caused by coarse grinding, fine polishing is required to remove the damaged layer and provide a smooth planar surface. While the initial grinding act is very short, considerable care, time and expense may be expended in subsequent planarization and polishing of a wafer, although CMP may be conducted relatively rapidly by proper choice of pads, abrasive particles, and etchant.

Conventional approaches to prevention of wafer damage during back side thinning and dicing have been largely concentrated on first providing a supportive protective layer 48 on the active surface to prevent damage to the circuitry. This act 106 is depicted in FIG. 4 and may be carried out in various configurations. For example, in U.S. Pat. No. 5,476,566 to Cavasin, a double-sided tape is used to attach a support layer to the active surface. The tape and substrate may be removed prior to packaging by exposure to UV radiation.

In U.S. Pat. No. 6,534,419 to Ong, electrical connection areas of the active surface are extended upwardly and a polymeric coating is applied to the active surface to cover the active surface. Backgrinding of the back side is then performed, followed by planarization of the active surface to expose the electrical connection areas.

In U.S. Pat. No. 6,506,681 to Grigg et al., a flip-chip wafer is produced by first installing the circuitry including solder bumps on the active surface, applying a molding compound between the bumps, and thinning the wafer by backgrinding. The molding compound is subsequently retained as an underfill material between the bumps.

In U.S. Pat. No. 6,403,449 to Ball, it is disclosed that the application of a protective layer to the active surface prior to backgrinding may actually enhance warping by applying surface tension to the wafer. The reference discloses a method of etching a pattern of grooves in the applied layer to relieve surface tension and decrease warpage.

U.S. Pat. No. 6,258,198 to Saito et al. describes a machine for applying a flexible protective film to the active surface of a wafer prior to backgrinding.

Following application of a protective layer 48 over the active surface 12, the wafer 10 is clamped in a chuck (not shown) in act 108 for backgrinding and planarization in acts 110 and 112, already described. The wafer 10 is mounted to enable these acts to be readily accomplished on the back side surface 14. FIG. 5 depicts the rough back side surface 14 following grinding, and FIG. 6 depicts the back side surface 14 as being relatively planar following fine polishing in act 112.

Following polishing of the back side surface 14, the wafer 10 is removed from the chuck, and dicing tape 50 is attached to the back side surface 14 to enable singulation of wafer 10 without loss or misplacement of individual semiconductor dice 16 (see FIG. 7). This act 118 is well known in the art and may be performed either before or following the removal of protective layer 48 from the active surface 12.

Singulation of the individual semiconductor dice 16 from the wafer 10 typically involves cutting the wafer into rectangular segments along streets 46 (see FIG. 2).

In general and as schematically shown in FIG. 8, a package 30 comprising a singulated semiconductor die 16 is encapsulated in a protective insulating material (encapsulant 52), usually a silicon-filled, transfer-molded, thermoplastic polymeric material, in act 122. Electrical connection elements may also be installed or exposed in this act if not previously effected at the wafer level for attaching the semiconductor die 16 to a carrier substrate. Such connections are not shown in FIG. 8 but are well known in the art to include leads, wire bonds conductive bumps, balls or columns, and the like.

In U.S. Pat. No. 5,164,815 to Lim, cracking and delamination of the encapsulation layer of a semiconductor package due to high-temperature soldering is purportedly overcome by leaving the die back side as a rough surface to improve adhesion of the packaging material thereto. The invention pertains to packages of relatively high thickness, e.g., about 50 mils (1270 $\mu$m) and does not address warping of or damage to the wafer itself. The back side is roughened by a conventional backgrinding process.

In U.S. Pat. No. 5,313,102 to Lim et al., cracking of the encapsulating layer of a semiconductor package due to subsequent exposure to high temperature is addressed by applying a coating of polyimide on the back side of the die prior to packaging. The polyimide is purported to enhance the adhesion of the encapsulation material and reduce cracking thereof. The invention again pertains to packages of high thickness, e.g., about 50 mils (1270 $\mu$m) and does not address warping of or damage to the wafer itself.

U.S. Pat. No. 6,184,064 to Jiang et al. teaches the forming of a pattern of contours such as grooves, furrows, etc. in a wafer back side surface to enhance adhesion of an encapsulant or die attach adhesive thereto. The depth of the contours is preferably no greater than about 25 $\mu$m.

U.S. Pat. No. 5,583,372 (hereinafter "the '372 patent") issued to King et al., assigned to the assignee of the present invention, discloses a semiconductor die including a metal layer deposited on the back side surface thereof for enhancing adhesion between the die and a molding compound, i.e., encapsulant compound. The metal layer is substantially oxide free and provides a uniform wetting surface for better adhesion. Furthermore, the '372 patent requires additional materials and fabrication processing, specifically depositing about 50 microinches of copper on the back side surface of the die and approximately 2–3 microinches of palladium over the copper layer.

U.S. Pat. No. 6,279,976 to Ball and assigned to the assignee of the present invention discloses a wafer-handling chuck assembly which uses a vacuum to hold a wafer in a planar configuration during operations thereon.

In view of the foregoing discussion of the problems associated with conventional techniques for backgrinding wafers to an enhanced thinness, which problems are further exacerbated by increasing wafer diameter, it would be advantageous to form such extremely thin wafers while counteracting warping forces. It would also be advantageous to reduce the incidence of wafer fracture and breakage, to heal fracture, scratches and grooves which may occur, and to provide a planar back side surface on the wafer. It would be further desirable to complete the formation of a wafer of enhanced thinness in a configuration which prevents subsequent propagation of lattice defects during die singulation, testing, packaging, attachment to a substrate, and end use. It would also be desirable to enhance the attachment of packaging materials to the back side of a die and to provide an ionic barrier over the wafer back side surface.

BRIEF SUMMARY OF THE INVENTION

The present invention, in an exemplary embodiment, comprises a method for producing a very thin substrate while eliminating or minimizing breakage, cracking and warping thereof at the bulk, or wafer, stage and thereafter. In the method of the present invention, a semiconductor substrate, for example, in the form of a wafer is mounted in a chuck for back side processing. The back side of the wafer is background to thin the wafer without significant polishing thereof. A reinforcement layer or film of highly penetrating hardenable material is then applied to the rough surface of the back side while the wafer continues to be supported in an unwarped condition. The applied layer or film is cured to fill in valleys or vugs, micro-fractures, scratches and grooves in the back side surface. The applied layer forms a smooth, generally planar surface over the rough topography of the back side. The applied layer is then hardened to a solid state before being released from the chuck. The hardened layer or film is tenaciously adhered to the back side and simultaneously counteracts forces tending to warp the wafer, heals defects in the back side surface and prevents warping, fracture or other damage to the back side surface during singulation of semiconductor dice from the wafer and subsequent packaging or attachment to a carrier substrate. The hardened reinforcement layer or film remains on each singulated semiconductor die and becomes part of its packaging or of an assembly of which it is a component. The reinforcement layer or film provides a planar back side surface for attachment to a carrier substrate, and the material of the reinforcement layer may be selected for compatibility with and adherence to a dielectric material used to encapsulate the die. Due to the presence of the reinforcement layer or film, the semiconductor dice cut from the wafer are maintained in an improved state of planarity and structural integrity to resist warping and mechanical damage. The surface roughness present at the conclusion of the backgrind operation enhances attachment of the reinforcement layer or film to the wafer back side surface. Thus, a thinning method that leaves the back side surface in a state of microroughness is preferred. A fine polishing act is not required and, in fact, is not desirable.

The reinforcement material may comprise, for example, a polymer of any of the groups of epoxies or acrylics or, more particularly, a thermal or ultraviolet (UV) cross-linkable polymer, or a two-part epoxy. Other classes of coatings which may be used include, without limitation, silicones, urethanes and siloxanes. Preferably, the reinforcement material, when hardened, forms a layer which is bonded securely to the wafer back side surface, resists internal bending stresses within the wafer material, has a coefficient of thermal expansion (CTE) similar to, and desirably slightly greater than, that of the wafer material, is resistant to cracking, has a substantially planar exposed surface, and is easily applied. The relatively coarse nature of the bare back side after grinding enhances the penetration and adhesion of the reinforcement layer or film. Use of a reinforcement material with a slightly greater CTE than that of a substrate material, such as silicon, will place the substrate material in a beneficial state of compression, resulting in a more robust structure.

The selected method for applying the reinforcement material to the bare substrate surface may be any method which will produce a relatively planar surface. For example, the coating method may comprise dispensing, screen-coating, stencil-coating, or spin-coating of a flowable material. Alternatively, the reinforcement material may be formed as a solid element, laminated to the substrate surface and bonded thereto. The reinforcement material may be a tape or film element applied to the substrate, heated to a flowable state to bond to the substrate and provide a substantially planar, exposed surface, and cooled to solidify. Other application methods include chemical vapor deposition (CVD) or plasma-enhanced chemical vapor deposition (PECVD). A Parylene™ deposition process may also be used, in which a dimer is vaporized to a monomer and exposed at lower temperatures to a surface, depositing a tenacious polymer on the surface. An exemplary dimer used in the Parylene™ process is di-para-xylene.

Although the present invention is primarily exemplified herein as applying to structures such as wafers formed of semiconductor materials, the term "substrate" as used herein includes other structures which have a surface requiring, or benefiting from, thinning and planarization including without limitation ceramic, glass and quartz substrates.

The advantages of the present invention include the fabrication of a wafer in which warping stresses are counteracted during manufacture and subsequent use of individual semiconductor dice singulated therefrom, wafer back side surface damage due to backgrinding is repaired, very thin wafers of large diameter may be effectively produced at a high yield rate, and polishing of the thinned wafer back side is not required, thus saving substantial time and expense. Furthermore, the layer or film of reinforcement material of the present invention may be used to counteract stresses on the wafer induced by the presence of a protective layer applied over the active surface prior to thinning. Still further, the layer or film of reinforcement material may be applied using well-developed process technologies. In addition, the applied layer or film of reinforcement material remains as a part of the finished semiconductor die and may be used to enhance adhesive attachment of the die to a packaging material or carrier and provide an ionic barrier.

Other features and advantages of the present invention will become apparent to those of ordinary skill in the art through consideration of the ensuing description, the accompanying drawings, and the appended claims. It should be noted that the illustrations herein may not necessarily be drawn to scale, and other embodiments which are not specifically shown or described herein are contemplated and encompassed by the present invention.

BRIEF DESCRIPTION OF THE SEVERAL VIEWS OF THE DRAWINGS

In the drawings, which depict exemplary embodiments of various features of the present invention.

DETAILED DESCRIPTION OF THE INVENTION

Figure 9:
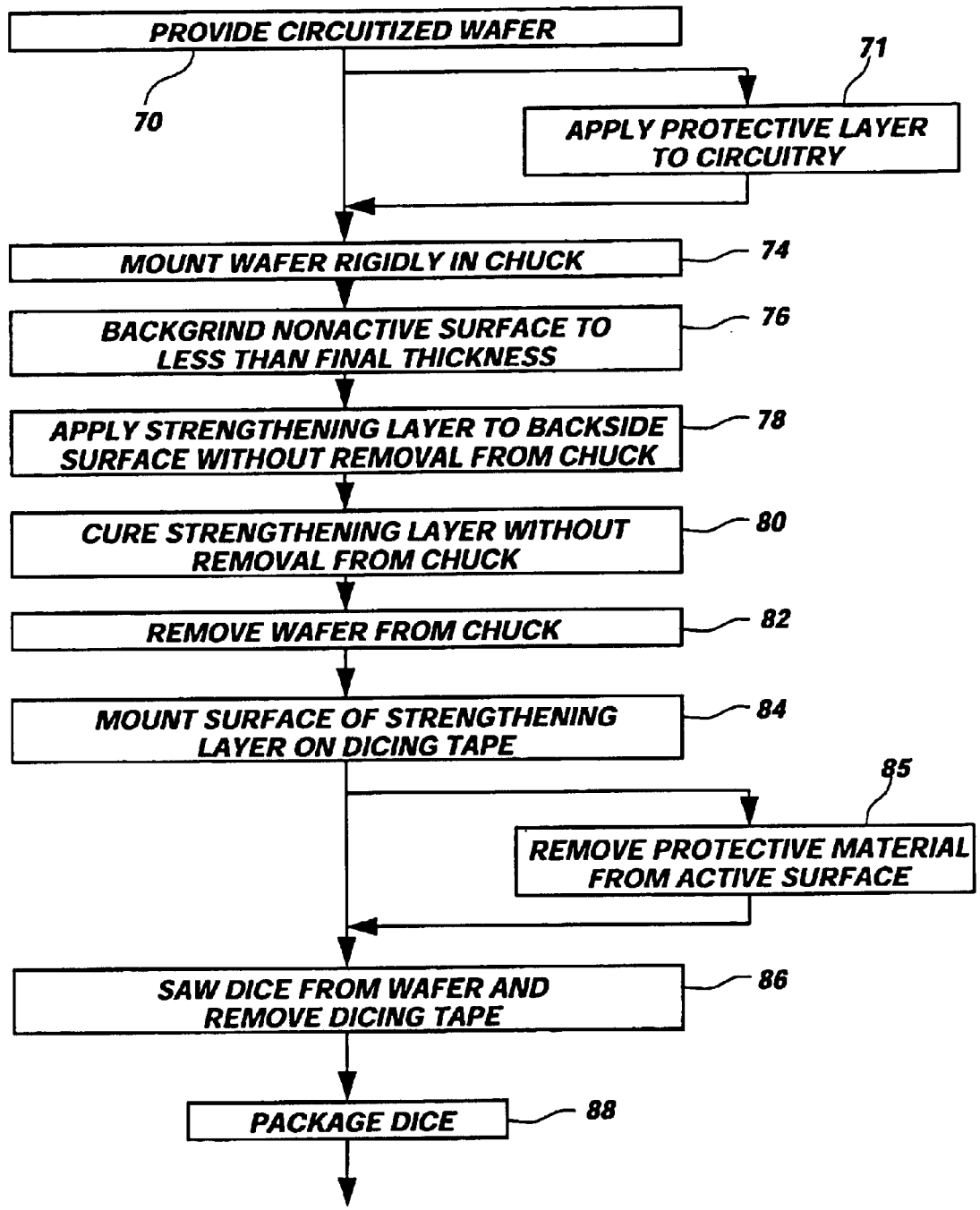
FIG. 9 is a flowchart showing the acts in a method of processing a semiconductor substrate from the bulk or wafer stage through packaging of singulated semiconductor dice of the present invention.

The general acts in the method of the present invention are shown in FIG. 9. A circuitized wafer 10 having integrated circuitry fabricated on the active surface thereof is provided (act 70).

In act 74, the wafer 10 is clamped into a fixture, for example, in the form of chuck 60 (see FIG. 10) such that the back side surface 14 is exposed for backgrinding in subsequent act 76. The chuck 60 that is used must be capable of holding and maintaining the wafer 10 in a planar configuration in spite of increasing warping tendencies that may be induced or magnified during grinding. Various wafer chucks 60 in the art are suitable for use. Especially applicable are those which rigidly grip the wafer edge (i.e., edge bead ring EBR) 58 (FIG. 10) about the circumference, maintaining the wafer in a nonwarping configuration. Another example of a chuck that may be used is described in U.S. Pat. No.

6,279,976 to Ball, assigned to the assignee of the present application, and hereby incorporated herein by reference thereto. This chuck holds a wafer against a planar backing structure by vacuum.

Figure 10:
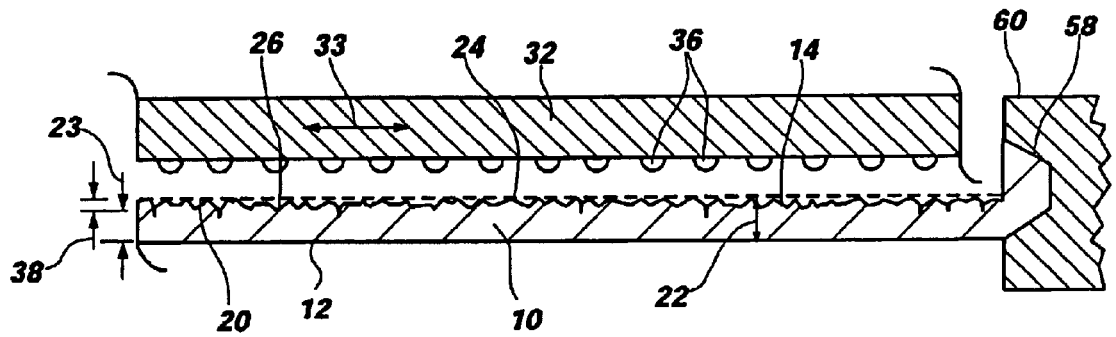
FIG. 10 is an enlarged cross-sectional side view of a portion of a semiconductor wafer following backgrinding according to a method of the present invention.

In act 76, illustrated in FIG. 10, the back side surface 14 is rough-ground to a level at which the mean wafer thickness 23 between the active surface 12 and the rough back side 14 is less than the desired final wafer thickness 22 (indicated in broken lines at thinned back side surface 20). The method chosen to backgrind may be a physical abrasive process, e.g., with an abrasive pad or wheel, CMP or other method which will quickly and effectively thin the wafer 10 and provide a rough, unpolished back side surface 14. Fine polishing is neither necessary nor desirable. It is preferred that the backgrinding effectively remove material to a level below the desired final wafer thickness 22, which is desirably less than about 10 mils. More preferably, the background mean wafer thickness 23 is less than about 5 mils, and thicknesses as low as 3 mils or less, i.e., 2 mils or 1 mil, may also be achieved. The backgrind leaves the back side surface 14 with a surface roughness factor $R_a$ which is generally between about 5% and about 40% of the mean thickness of the back side ground wafer 10. Expressed another way, the surface roughness factor $R_a$ is between about 2 µm and about 15 µm for wafers 10 as thin as about 2 mils or less (about 51 µm). An additional fine-grinding act may be performed only in the event that the rough backgrinding leaves the back side surface in an excessively rough state.

Figure 1:
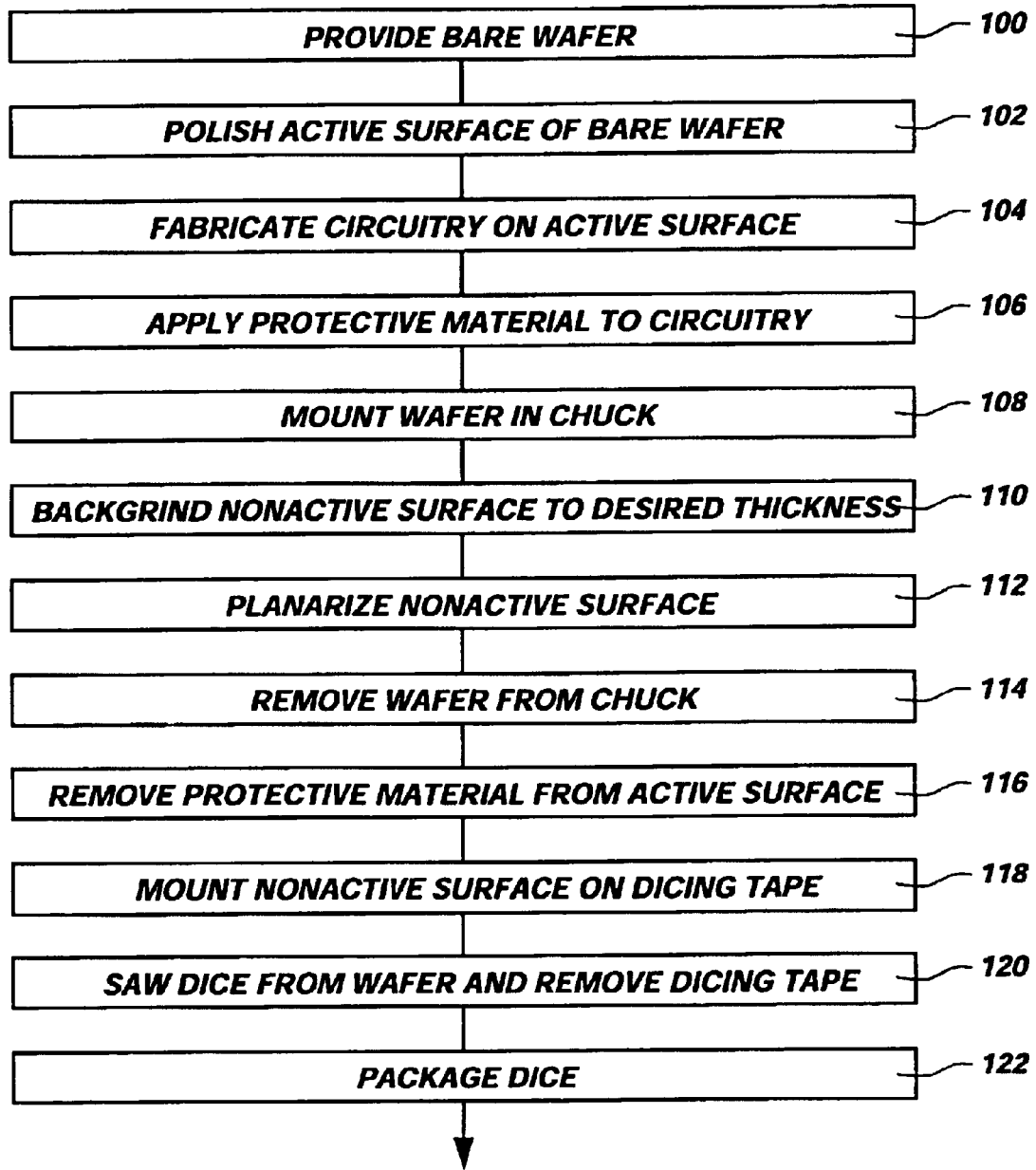
FIG. 1 is a flow diagram showing the general acts followed in the prior art for producing packaged dice from a semiconductor wafer.
Figure 2:
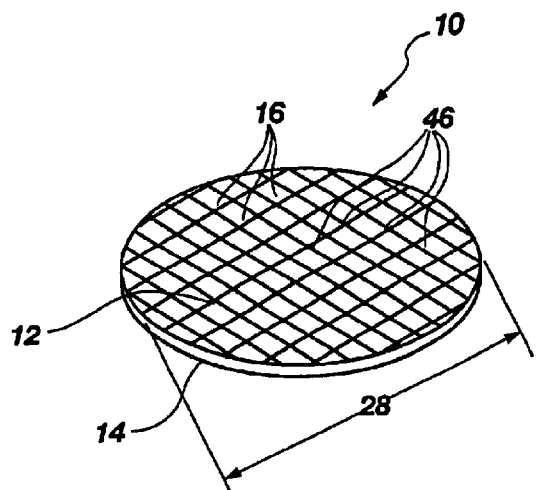
FIG. 2 is a perspective view of an exemplary, conventional semiconductor wafer.
Figure 3:
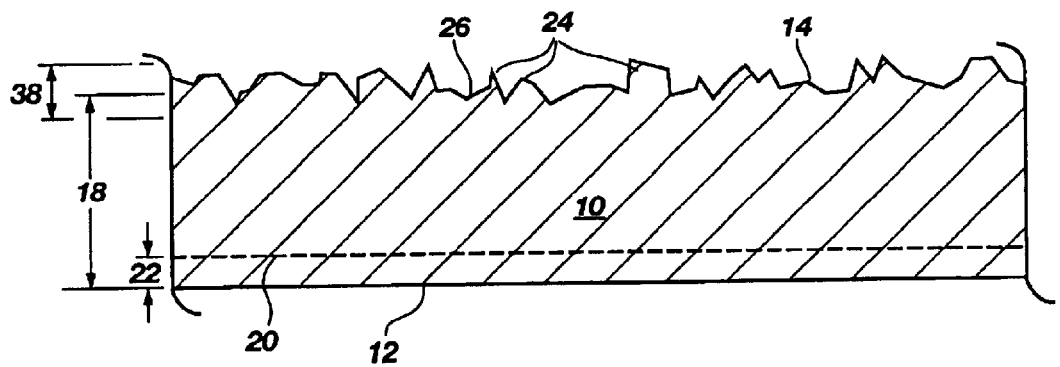
FIG. 3 is an enlarged cross-sectional side view of a portion of a semiconductor wafer prior to thinning according to the prior art.

Acts 70, 74, and 76 are, in terms of implementation, similar to prior art acts 100, 102, 104, 108, and 110 shown in FIG. 1.

Continuing with FIG. 9, the next act 78 is to apply a layer 40 of a reinforcement material to the rough back side surface 14. The reinforcement layer 40 is applied without removing the wafer 10 from its rigid position in chuck 60, thus maintaining the wafer 10 in an unwarped configuration. In general, the reinforcement layer 40 is formed over rough back side surface 14 to exhibit a substantially planar, level thinned back side surface 20. The reinforcement layer 40 fills recesses in the topography (valleys 26 between peaks 24) of back side surface 14 and preferably overcovers the peaks 24 to at least a very minimal degree. In general, it is desirable to use the thinnest reinforcement layer 40 that will achieve the desired antiwarping effect so as to leave as much of the substrate material intact while still achieving a desired thinness. Thus, the reinforcement layer 40, at a minimum, covers the highest peaks 24 of the rough back side topography, but may be of greater thickness thereover, such as an additional 100 µm or more. Preferably, the additional layer thickness above the peaks 24 is up to about 10 µm.

The reinforcement material may desirably comprise any material which has the following qualities:

(a) it may be bonded securely to the back side surface and hardened to form a strong, rigid, permanent support for the substrate material for maintaining the wafer in an unwarped state when released from the grinding chuck and subjected to subsequent processing and handling;

(b) it readily and substantially completely penetrates grooves, cracks and other vugs in the back side surface of the wafer;

(c) it exhibits a coefficient of thermal expansion (CTE) substantially similar to, and preferably slightly greater than, the CTE of the semiconductor material of the wafer, minimizing any CTE mismatch which would induce wafer warpage due to temperature variations experienced during processing and subsequent operation while placing the semiconductor material in a beneficial state of compression; and (d) it readily forms a relatively planar external surface when hardened.

Further, although this is not a requirement of the invention, it is normally desirable that the material of the reinforcement layer be a dielectric material.

Materials from which the reinforcement layer 40 may be formed include various polymers such as, for example, without limitation, epoxies, acrylics, silicones, urethanes, siloxanes, and Parylenes™. Thus, for example, the reinforcement layer 40 may be applied as a liquid polymer by application methods known in the art which will produce a relatively planar surface. For example, the coating method may comprise simple dispensing, screen-coating, stencil-coating, or spin-coating of a flowable material. The reinforcement material may be a thermoset cross-linkable polymer or a UV-stimulated cross-linkable polymer, commonly termed a "photopolymer." In another variation, an epoxy material can be cured to a so-called "B" stage of tackiness, at which it is still flowable. The epoxy material may then be applied to the back side surface 14 and reheated to complete the cure, bond to the surface and harden. It is contemplated that a layer of epoxy material may be applied to a backing sheet carrying a release layer, cured to a "B" stage and applied to the back side surface 14. The backing may then be stripped off, and the epoxy cure and hardening completed.

Other application methods which may be used include CVD and PECVD, in which the reinforcement material is applied as a vapor. These deposition methods are well known in the art.

In a deposition method of newer development, the Parylene™ deposition process may be used. In this method, an organic dimer is heated to form monomers and then applied at a lower temperature to a back side surface 14 where it deposits as a polymeric reinforcement layer 40. A dimer such as di-para-xylene may be used.

Another deposition method which may be used comprises the formation of a tape or film element of partially polymerized material. The tape or film may then be applied to the back side surface 14, heated to flow, bond to the surface, level and planarize, and finally cooled to a solid state.

Figure 11:
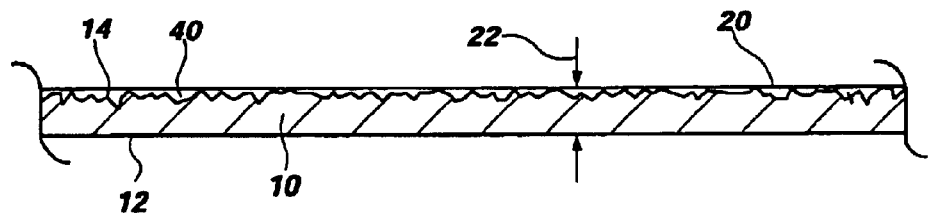
FIG. 11 is an enlarged cross-sectional side view of a portion of a semiconductor wafer following application and hardening of a reinforcement layer or film to the back side surface thereof according to the present invention.

In act 80, the polymer reinforcement layer 40 may be subjected to a final cure, typically by a thermal, UV radiation or other means known in the art, while the chuck 60 continues to hold and support the wafer 10 in a rigid, nonwarping condition. The term "cure" is used herein in its broadest context, indicating only that a reinforcement material applied to a back side surface 14 of a wafer 10 solidifies and bonds thereto. The resulting wafer 10 is depicted in FIG. 11 with a desired final thickness 22 between the active surface 12 and the final back side surface 20.

Figure 12:
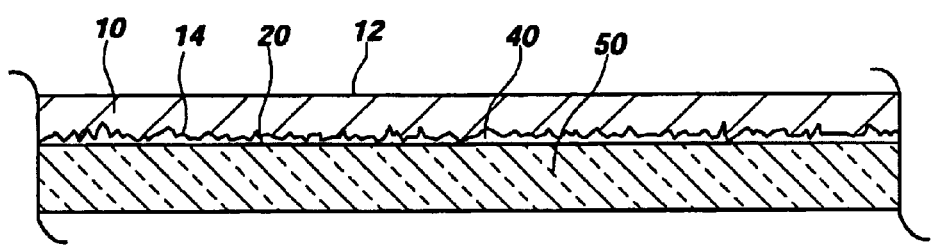
FIG. 12 is an enlarged cross-sectional side view of a portion of a semiconductor wafer following application of dicing tape to the back side surface thereof according to a method of the present invention.
Figure 13:
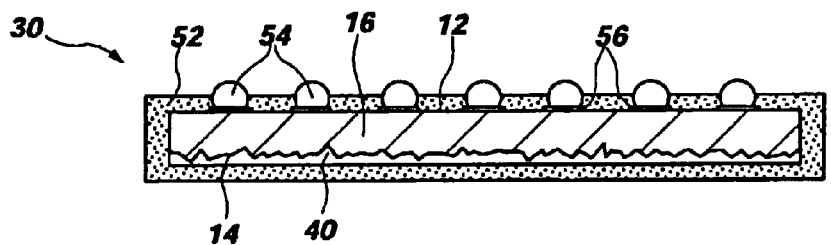
FIG. 13 is an enlarged cross-sectional side view of a semiconductor die following singulation from a wafer and packaging according to a method of the present invention.

In act 82, the wafer with reinforcement layer 40 is removed from the chuck 60. Of general prior art practice, a dicing tape 50 is attached to the final thinned back side surface 20 (act 84) as seen in FIG. 12, and individual semiconductor dice 16 (FIG. 1) are singulated by cutting along the streets (cut lines) 46 (in act 86). In a final act 88, a package 30 (see FIG. 13) is typically formed by encapsulating the singulated semiconductor dice 16 with a silicon-filled polymer encapsulant 52 and having (by way of example only) electrical terminals 54 on conductive pads 56 extending therethrough for connection to a substrate. The reinforcement layer 40 remains on the semiconductor die 16 and becomes part of the protective packaging, retaining its resistance to any warpage-inducing stresses resident within the substrate of the semiconductor die 16. The reinforcement layer 40 may be formulated to also provide a high-adhesion surface for encapsulant 52 applied over the covered back side surface 14 and prevents foreign matter from grinding from collecting within the encapsulant 52 and causing fracture of the hardened encapsulant.

Suitable materials for reinforcement layer include, without limitation: Ablebond 2025 thermally curable nonconductive die attach adhesive Ableflex 6200 B-stageable nonconductive adhesive from Ablestik Laboratories of Rancho Dominguez, Calif.; T693/R3001 thermally curable nonconductive adhesive from Nagase Chemtex Corporation of Osaka, Japan; and #5031 wafer back side tape from Lintec Corporation of Tokyo, Japan.

Returning now to FIG. 9, another variation of the instant invention is also indicated. Thus, before mounting the wafer 10 in a chuck 60 (act 74) for backgrinding (act 76), a protective layer 48 is formed or applied in act 71 over the circuitry on the active surface 12. This act 71 may be taken to avoid or reduce any damage to the circuitry by pressure thereof against the clamping chuck 60. The protective layer 48 is illustrated as part of the prior art in FIGS. 4—6, and 6 and may be applied to the inventive method as well. The protective layer 48 is shown as removed in act 85 prior to dicing of the wafer 10.

The method of the present invention for thinning a wafer has numerous advantages. First, it is possible to produce very thin dice, which in turn results in desirably thin packages for many package volume-constrained applications. In addition, the wafer and resulting dice retain resistance against warping during and after singulation to facilitate packaging or direct attachment to a substrate, and subsequent use. Furthermore, cracking and fracture damage to wafers is largely eliminated. Still further, the reinforcement layer encapsulates foreign particulates and other contamination produced during backgrinding, and provides a clean surface for good adhesion of a packaging material thereto. The present invention also makes it possible to produce very thin semiconductor dice at a high yield rate. The time-consuming and costly prior art acts of fine polishing or plasma etching of a wafer subsequent to backgrinding are eliminated, resulting in faster semiconductor die fabrication and reduced production cost.

The invention is applicable to semiconductor wafers formed from any thinnable material with a tendency to fracture and/or warp when thinned to a desired thickness value. Thus, it may be used for the back side thinning of, for example, silicon, gallium arsenide, germanium and indium phosphide materials, as well with substrates of other semiconductor materials. The method may be used for thinning nonsemiconductor materials, such as quartz and glasses, as well.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Moreover, features from different embodiments of the invention may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims, are to be embraced thereby.

What is claimed is:

1. A semiconductor wafer having an active surface and a back side surface and including a plurality of semiconductor dice formed thereon, wherein:
   the active surface includes integrated circuitry thereon;
   the back side surface is in a back-ground state;
   a solid material extends over and is bonded to the back side surface; and
   an interface between the back side surface and the solid material has a mean surface roughness factor $R_a$ of between about 5% and about 40% of a mean thickness of the semiconductor wafer.

2. The semiconductor wafer of claim 1, wherein semiconductor material of the semiconductor wafer comprises one of silicon, gallium arsenide, germanium and indium phosphide.

3. The semiconductor wafer of claim 1, wherein the interface has a mean surface roughness factor $R_a$ between about 2 $\mu$m and about 15 $\mu$m.

4. The semiconductor wafer of claim 1, wherein the solid material comprises a polymer.

5. The semiconductor wafer of claim 1, wherein the solid material includes at least one of the polymer groups comprising epoxies, acrylics, silicones, urethanes, siloxanes and Parylenes™.

6. The semiconductor wafer of claim 1, wherein the solid material comprises one of a thermoset cross-linkable polymer, a UV cross-linkable polymer and a two-part epoxy.

7. The semiconductor wafer of claim 1, wherein the solid material comprises a Parylene™ polymer.

8. The semiconductor wafer of claim 1, wherein the solid material has a mean thickness of about 100 $\mu$m or less over a highest topographic feature on the back side surface.

9. The semiconductor wafer of claim 1, wherein the solid material has a mean thickness of about 10 $\mu$m or less over a highest topographic feature on the back side surface.

10. The semiconductor wafer of claim 1, wherein the solid material has a generally planar exposed surface.

11. The semiconductor wafer of claim 1, wherein the solid material comprises an ionic barrier.

12. The semiconductor wafer of claim 1, wherein the semiconductor wafer has a thickness of about 4 mils or less.

13. The semiconductor wafer of claim 1, wherein the semiconductor wafer has a thickness of about 2 mils or less.

14. The semiconductor wafer of claim 1, wherein the semiconductor wafer has a nominal diameter of at least about 200 mm (about 8 inches).

15. The semiconductor wafer of claim 1, wherein the semiconductor wafer has a nominal diameter of at least about 300 mm (about 12 inches).

16. The semiconductor wafer of claim 1, wherein material of the semiconductor wafer is in a state of compression.

17. A semiconductor package, comprising:
   a die of semiconductor material having an active surface and a back side surface;
   integrated circuitry on the active surface;
   wherein the back side surface is in a roughly back-ground state and includes a solid material extending thereover and bonded thereto;
   a protective material encapsulating at least a portion of the die and the solid material extending over the back side surface; and
   a plurality of conductive terminals exposed through the protective material on a surface of the package;
   wherein an interface between the back side surface and the solid material has a mean surface roughness factor $R_a$ of between about 5% and about 40% of the mean thickness of the die.

18. The package of claim 17, wherein the interface has a mean surface roughness factor $R_a$ of between about 2 μm and about 15 μm.

19. The package of claim 17, wherein the solid material comprises a polymer.

20. The package of claim 17, wherein the solid material includes at least one of the polymer groups comprising epoxies, acrylics, silicones, urethanes, siloxanes and Parylenes™.

21. The package of claim 17, wherein the solid material comprises one of a thermoset cross-linkable polymer, a UV cross-linkable polymer and a two-part epoxy.

22. The package of claim 17, wherein the solid material comprises a Parylene™ polymer.

23. The package of claim 17, wherein the semiconductor material of the die is in a state of compression.

* * * * *

UNITED STATES PATENT AND TRADEMARK OFFICE
CERTIFICATE OF CORRECTION

| | | |
|---|---|---|
| PATENT NO. | : 6,940,181 B2 | Page 1 of 2 |
| APPLICATION NO. | : 10/690339 | |
| DATED | : September 6, 2005 | |
| INVENTOR(S) | : James M. Derderian and Nathan R. Draney | |

It is certified that error appears in the above-identified patent and that said Letters Patent is hereby corrected as shown below:

On the title page:
In ITEM (57), ABSTRACT,
   8th line,                              change "enhance" to --enhances-- and change "provide" to --provides--

In the drawings:
   In FIG. 9,                        change first line of label within the box identified by reference numeral 78 from "APPLY STRENGTHENING LAYER TO BACKSIDE" to --APPLY STRENGTHENING LAYER TO BACK SIDE-- (as shown below)

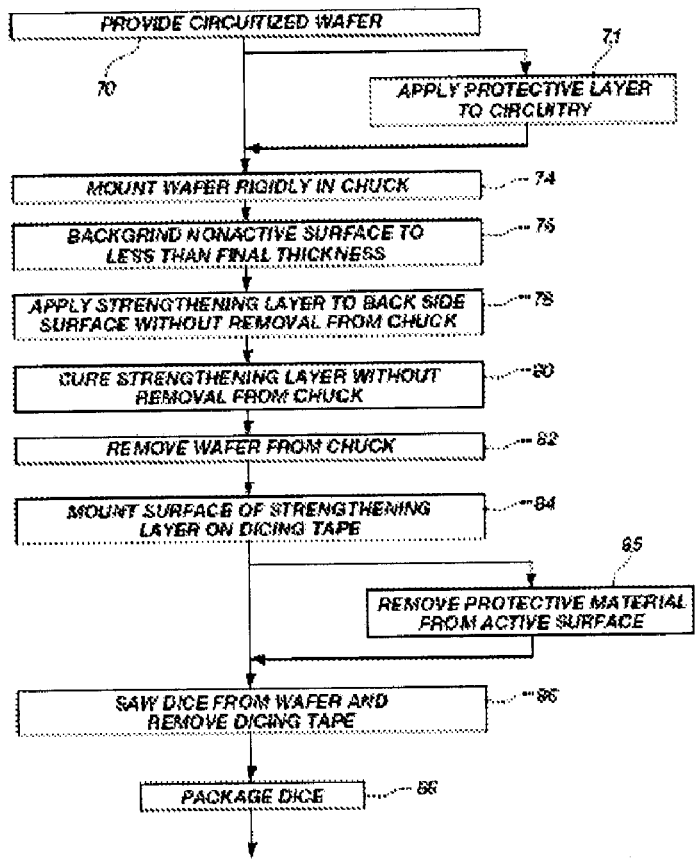

FIG. 9

UNITED STATES PATENT AND TRADEMARK OFFICE
CERTIFICATE OF CORRECTION

Figure 4:
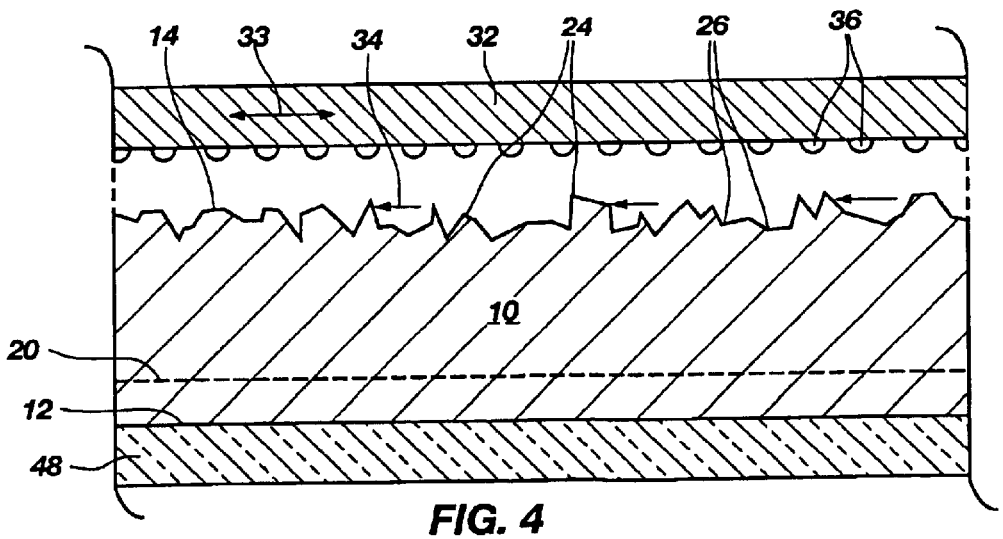
FIG. 4 is an enlarged cross-sectional side view of a portion of a semiconductor wafer after application of an exemplary protective layer on the active surface thereof prior to backgrinding the noncircuit side thereof according to the prior art.
Figure 5:
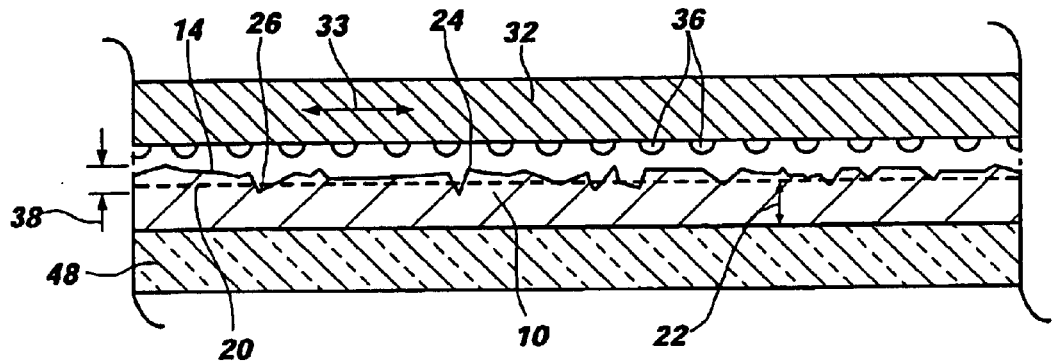
FIG. 5 is an enlarged cross-sectional side view of a portion of a semiconductor wafer after backgrinding to a wafer thickness approaching a desired final thickness according to the prior art.
Figure 6:
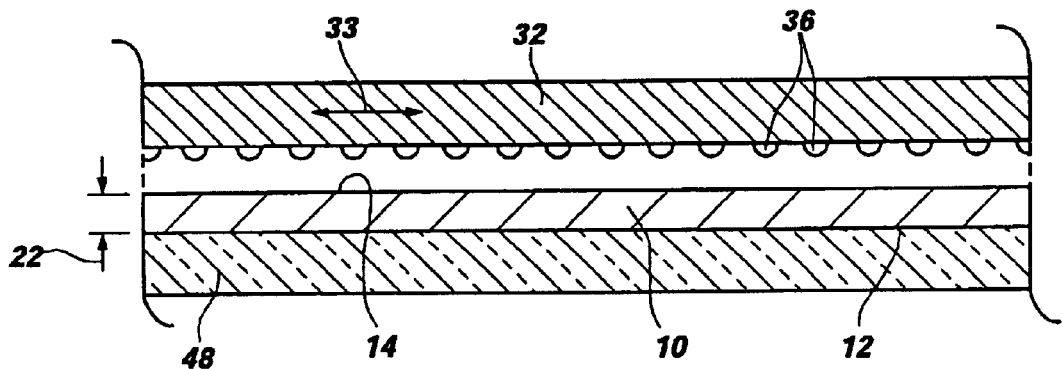
FIG. 6 is an enlarged cross-sectional side view of a portion of a semiconductor wafer after fine polishing following backgrinding according to the prior art.
Figure 7:
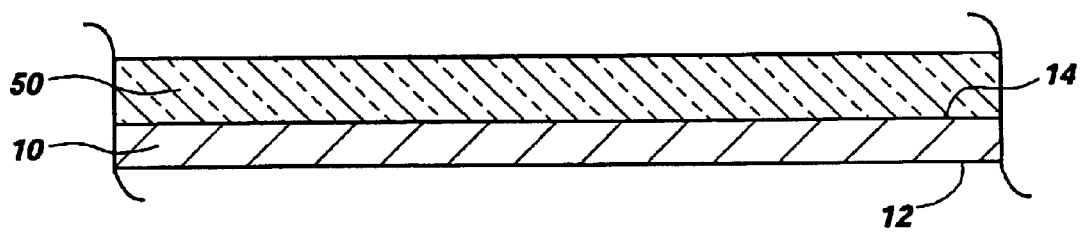
FIG. 7 is an enlarged cross-sectional side view of a portion of a semiconductor wafer following removal of a protective layer from the active surface and application of a dicing tape to the back side according to the prior art.
Figure 8:
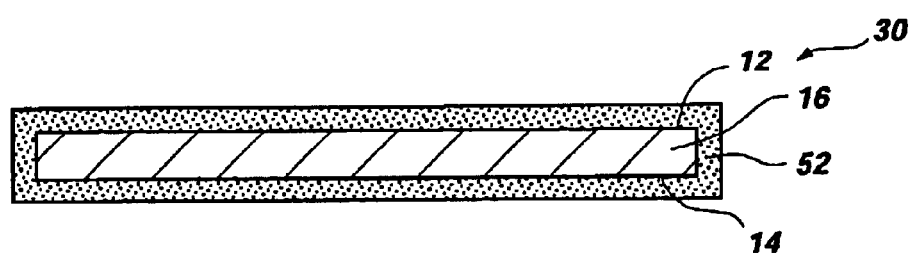
FIG. 8 is a schematic cross-sectional side view of a semiconductor die manufactured, singulated, and encapsulatingly packaged according to the prior art.

PATENT NO. : 6,940,181 B2
APPLICATION NO. : 10/690339
DATED : September 6, 2005
INVENTOR(S) : James M. Derderian and Nathan R. Draney It is certified that error appears in the above-identified patent and that said Letters Patent is hereby corrected as shown below:

In the specification:

| | | |
|---|---|---|
| COLUMN 3, | LINE 53, | change "packaging (act 122) in" to --packaging in-- |
| COLUMN 5, | LINE 29, | change "bonds conductive" to --bonds, conductive-- |
| COLUMN 10, | LINE 53, | change "final back" to --final thinned back-- |
| COLUMN 11, | LINE 6, | change "encapsulant." to --encapsulant 52.-- |
| COLUMN 11, | LINE 22, | change "FIGS. 4—6," delete "and 6" |

Signed and Sealed this

First Day of July, 2008

JON W. DUDAS
*Director of the United States Patent and Trademark Office*